US005113840A

United States Patent [19]

Taruya et al.

[11] Patent Number: 5,113,840

[45] Date of Patent: May 19, 1992

[54] IGNITER FOR AN ENGINE

[75] Inventors: Masaaki Taruya; Mitsuru Koiwa, both of Himeji, Japan

[73] Assignee: Mitsubishi Denki Kabushiki Kaisha, Tokyo, Japan

[21] Appl. No.: 707,546

[22] Filed: May 30, 1991

[30] Foreign Application Priority Data

Jun. 14, 1990 [JP] Japan .............................. 2-62224[U]

[51] Int. Cl.$^5$ ............................ F02P 7/06; H05K 7/02

[52] U.S. Cl. .................................... 123/644; 123/609; 361/400

[58] Field of Search ............... 123/609, 610, 611, 623, 123/625, 644, 651, 652; 361/392, 395, 397, 400, 405, 406

[56] References Cited

U.S. PATENT DOCUMENTS

| | | | |
|---|---|---|---|
| 4,248,200 | 2/1981 | Sugiura et al. | 123/644 |
| 4,366,800 | 1/1983 | Seeger et al. | 123/644 X |
| 4,367,722 | 1/1983 | Mizuno | 123/644 |
| 4,649,888 | 3/1987 | Kawai et al. | 123/644 X |
| 4,818,823 | 4/1989 | Bradley | 361/400 X |
| 4,818,895 | 4/1989 | Kaufman | 361/400 X |
| 4,949,222 | 8/1990 | Bender et al. | 361/400 |

FOREIGN PATENT DOCUMENTS 0009371 6/1988 Japan .

*Primary Examiner*—Willis R. Wolfe

*Attorney, Agent, or Firm*—Sughrue, Mion, Zinn, Macpeak and Seas

[57] ABSTRACT

An igniter for an internal combustion engine is provided which is small in size, efficient and inexpensive to manufacture. The entire manufacturing process can be easily automated. The igniter includes a power transistor circuit for turning on and off the current supply to a primary winding of an ignition coil, a current detector for detecting a current supplied to the ignition coil primary winding, and a current limiter for controlling the current supplied to the ignition coil primary winding based on the current detected by the current detector. The current detector comprises a conductor in the form of a conductive wire separately formed from the current limiter and connected between ground and a junction between the power transistor circuit and the current limiter.

5 Claims, 3 Drawing Sheets

IGNITER FOR AN ENGINE

BACKGROUND OF THE INVENTION

The present invention relates to an igniter for controlling a current supplied to a primary winding of an ignition coil for an internal combustion engine.

An example of a known igniter is illustrated in FIGS. 6 and 7 which are a circuit diagram and a partially cut-away plan view thereof, respectively. In FIG. 6, the known igniter, generally designated by reference character I, includes a power transistor circuit 1 for turning on and off the current supply to a primary winding *2a* of an ignition coil 2 which has a secondary winding *2b* connected through an unillustrated distributor to a plurality of spark plugs (not shown), a current detector 3 in the form of a resistor connected between the power transistor circuit 1 and ground for detecting a voltage thereacross developed by a current flowing from a power supply 4 to ground through the primary winding *2a* and the power transistor circuit 1 when it is turned on, and a current limiter 5 connected through a resistor *9a* to a junction between the power transistor circuit 1 and the resistor 3 for limiting the current supplied from the power supply 4 to the primary winding *2a* of the ignition coil 2 based on the voltage across the resistor 3. A resistor *9b* has one end thereof connected to a junction between the resistor *9a* and the current limiter 5, and the other end thereof to ground. The power transistor circuit 1 includes an NPN type power transistor *1a* which has a collector connected to one end of the primary winding *2a* of the ignition coil 2, and an emitter connected to one end of the resistor 3, and an NPN type switching transistor *1b* which has a collector connected to the collector of the power transistor *1a*, an emitter connected to a base of the power transistor *1a* and a base connected through a resistor *9c* to a junction between one end of a resistor 11, which is connected at the other end thereof to the power source 4, and a collector of a transistor 12. The transistor 12 has an emitter connected to ground and a base connected to a signal generator (not shown) which generates an ignition signal in synchronism with the rotation of an engine.

The overall construction of the known igniter I is shown in FIG. 7. In this figure, housed in a casing 6, is a hybrid integrated circuit board 7 (hereinafter referred to as an HIC board), which has a hybrid integrated circuit (hereinafter referred to as an HIC) comprising the resistors *9a*–*9c* (not shown in FIG. 7), a conductive layer forming the current detecting resistor 3, an IC chip forming the current limiter 5 and the like formed on the surface thereof. The HIC board 7 has a plurality of terminals *7a*–*7f* formed on the surface thereof which are electrically connected to the IC chip through interior circuits (not shown) formed therein. A connector 10 is integrally formed with the casing 6 and has a plurality of connector terminals *10a*–*10c* which are connected to the terminals *7a*–*7c*, respectively, on the HIC board 7. The HIC board 7 is fixedly secured through an elastomeric adhesive (not shown) to a bottom interior surface of the casing 6. The conductive layer 3 is formed of a thin metallic film and has one end thereof connected at the terminal *7e* to the emitter of the power transistor *1a* of the power transistor circuit 1, and the other end thereof connected at the terminal *7c* to the connector terminal *10b* which is adapted to be connected to ground when the connector 10 is coupled to an appropriate portion of an ignition apparatus which includes the elements 2, 4, 11 and 12 of FIG. 6. The other terminals of the power transistor circuit 1 are respectively connected to the corresponding terminals *7d*, *7f* on the HIC board 7.

In operation, when an ignition signal is supplied from the unillustrated signal generator to the base of the transistor 12, the transistor 12 is made conductive, thus turning on the power transistor circuit 1. As a result, a current flows from the power supply 4 to ground through the primary winding *2a* of the ignition coil 2, the now conductive power transistor *1a* and the resistor 3, so that a voltage is developed across the resistor 3 and supplied to the current limiter 5. Based on this voltage, the current limiter 5 controls the primary current flowing in the primary winding *2a* of the ignition coil 2. In accordance with the primary current, a high voltage is developed across the secondary winding *2b* of the ignition coil 2, and supplied to a distributor (not shown) for causing an appropriate spark plug to generate a spark.

With the known igniter I as constructed above, however, upon assembly thereof, it is necessary to manually secure the HIC board 7, which is very brittle and fragile, to the bottom interior surface of the casing 6 with an elastomeric adhesive using utmost care so as to prevent any damage thereto. In this connection, although the elastomeric adhesive serves to absorb stress which may be applied to the HIC board 7 when secured to the casing 6, such an assembly operation is rather troublesome and inefficient, adding to the cost of manufacture. In addition, in order to prevent any inadvertent damage to the IC chip formed on the surface of the HIC board 7 upon assembly thereof, it is necessary to provide a protective coating on the surface of the HIC board 7 covering the IC chip. Further, after having been secured to the casing 6, the HIC board 7 must be dried or held in a high-temperature atmosphere for a predetermined time (i.e., around one hour or so) until the adhesive solidifies. For these reasons, it is difficult to automate the entire process of manufacture.

Moreover, since a large primary current flows in the conductive layer 3 formed on the surface of the HIC board 7, the thin film-like conductive layer 3 must have sufficient length and width for providing a necessary resistance for current detection as well as allowing such a large primary current to flow. This results in an increase in the size of the HIC board 7 and hence the size of the entire igniter.

SUMMARY OF THE INVENTION

Accordingly, the present invention is intended to overcome the above-described problems encountered with the known igniter.

An object of the invention is to provide a novel and improved igniter for an internal combustion engine which enables the automation of the entire process of manufacturing the igniter.

Another object of the invention is to provide a novel and improved igniter for an internal combustion engine which is small in size, efficient and inexpensive to manufacture.

In order to achieve the above objects, according to the present invention, there is provided an igniter for an internal combustion engine comprising a power transistor circuit for turning on and off the current supply to a primary winding of an ignition coil, a current detector for detecting a current supplied to the ignition coil primary winding, and a current limiter for controlling the current supplied to the ignition coil primary winding based on the current detected by the current detector. The current detector comprises a conductor separately formed from the current limiter and connected between ground and a junction between the power transistor circuit and the current limiter.

Preferably, the current detector comprises a conductive wire having a predetermined electric resistance sufficient for developing a voltage thereacross when the power transistor circuit is turned on.

In one form, the power transistor circuit, the current detector and the current limiter are housed in a casing which has a connector integrally formed therewith. The connector has a first, a second and a third connector terminal which extend at their one end into the casing. The power transistor circuit is fixedly mounted on the casing and has a first lead connected to the first connector terminal, a second lead connected to one end of the current detector which is connected at the other end thereof to the second connector terminal, and a third lead connected to the third connector terminal. The current limiter comprises an IC chip mounted on the second connector terminal having three leads which are respectively connected to the second connector terminal, the third connector terminal and a junction between the current detector and the first lead of the power transistor circuit.

In another form, the power transistor circuit, the current detector and the current limiter are mounted on a lead frame and resin molded into an integral package having a plurality of terminal leads. The integral package is received in and fixedly mounted on a casing which is integrally formed with a connector having a plurality of connector terminals. The package has a plurality of terminal leads respectively connected to the connector terminals.

The above and other objects, features and advantages of the invention will be more readily apparent from the ensuing detailed description of a few preferred embodiments of the invention taken in conjunction with the accompanying drawings.

DESCRIPION OF THE PREFERRED EMBODIMENTS

A few preferred embodiments of the present invention will now be described in detail while referring to the accompanying drawings.

Figure 1:
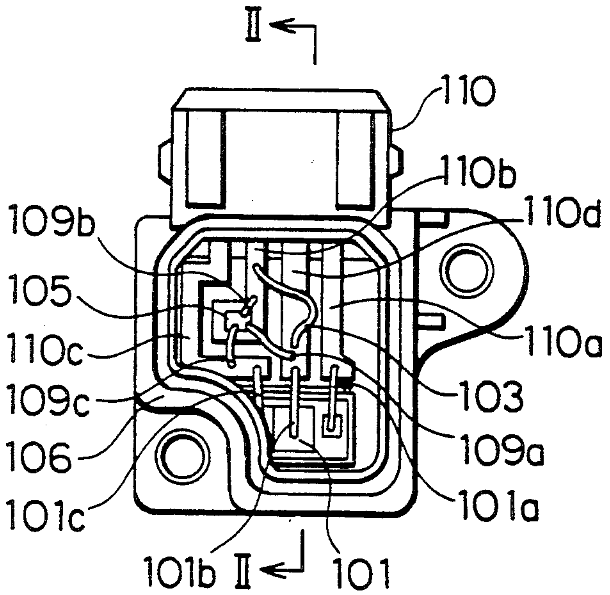
FIG. 1 is a partially cut-away plan view of an igniter in accordance with one embodiment of the invention.
Figure 2:
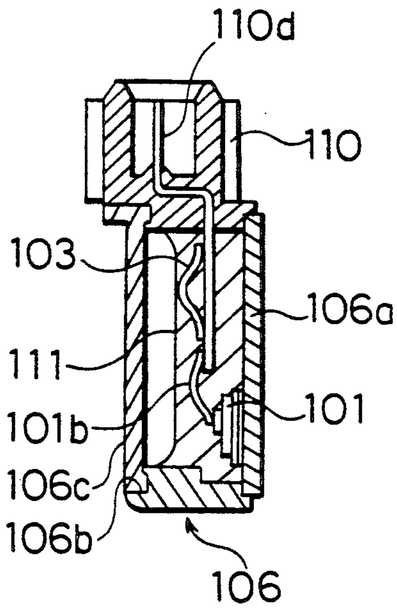
FIG. 2 is a cross section taken along line II—II of FIG. 1.

Referring to the drawings and first to FIGS. 1 and 2, there is shown an igniter for an internal combustion engine constructed in accordance with the invention. The igniter of this embodiment has substantially the same circuit arrangement as that of the known igniter of FIG. 6, and includes a flat box-shaped casing 106 for housing therein various electric or electronic elements with a connector 110 integrally formed therewith for providing electrical connection between the internal elements and external electrical elements such as an ignition coil, etc. Housed in the casing 106 are a power transistor circuit 101 (corresponding to the circuit 1 of FIG. 6) fixedly mounted on a heat dissipating plate 106*a*, which is a bottom plate of the casing 106, and a current limiter 105 in the form of an IC chip (corresponding to the current limiter 5 of FIG. 6). The connector 110 has a plurality of first through fourth connector terminals 110*a*–110*d* in the form of flat plate-like conductors extending into the casing 106. The power transistor circuit 101 includes an unillustrated power transistor (corresponding to the power transistor 1*a* of FIG. 6) which has a collector connected through a lead wire 101*a* to the first connector terminal 110*a* which is adapted to be connected to one end of a primary winding of an ignition coil (not shown), an emitter connected through a lead wire 101*b* to the fourth connector terminal 110*d* and thence through a current detecting resistor 103 (corresponding to the resistor 3 of FIG. 6) in the form of a conductive wire of aluminum to the second connector terminal 110*b* which is adapted to be connected to ground, and an unillustrated switching transistor (corresponding to the transistor 1*b* of FIG. 6) which has a collector connected to the collector of the power transistor, an emitter connected to a base of the power transistor and a base connected through a lead wire 101*c* to the third connector terminal 110*c* which is adapted to be connected to a signal generator (not shown) which generates an ignition signal representative of predetermined crank positions of each cylinder of an engine in synchronism with the rotation thereof. The IC chip 105 is mounted on the second connector terminal 110*b* and connected through a resistor 109*a* in the form of a conductive wire of aluminum to a junction of the fourth connector terminal 110*b* at which the lead wire 110*d* from the emitter of the transistor circuit 101 and the current detecting resistor 103 are connected to each other. The IC chip 105 is also connected through a resistor 109*b* in the form of a conductive wire of aluminum to the second connector terminal 110*b* and through a resistor 109*c* in the form of a conductive wire to the third connector terminal 110*c*. The connections of the lead wires 101*a*–101*c* and the conductive wires 103 and 109*a*–109*c* to the connector terminals 110*a*–110*d* are effected by such as soldering.

A molten, electrically insulating resin is filled from an opening 106*b* into the casing 106 and cooled to provide a solid protective coating 111 for sealingly covering and protecting the transistor circuit 101 with the lead wires 101*a*–101*c*, the IC chip 105, and the conductive wires 103 and 109*a*–109*c*. A cover 106*c* is fitted to close the opening 106*b* in the casing 106.

Figure 6:
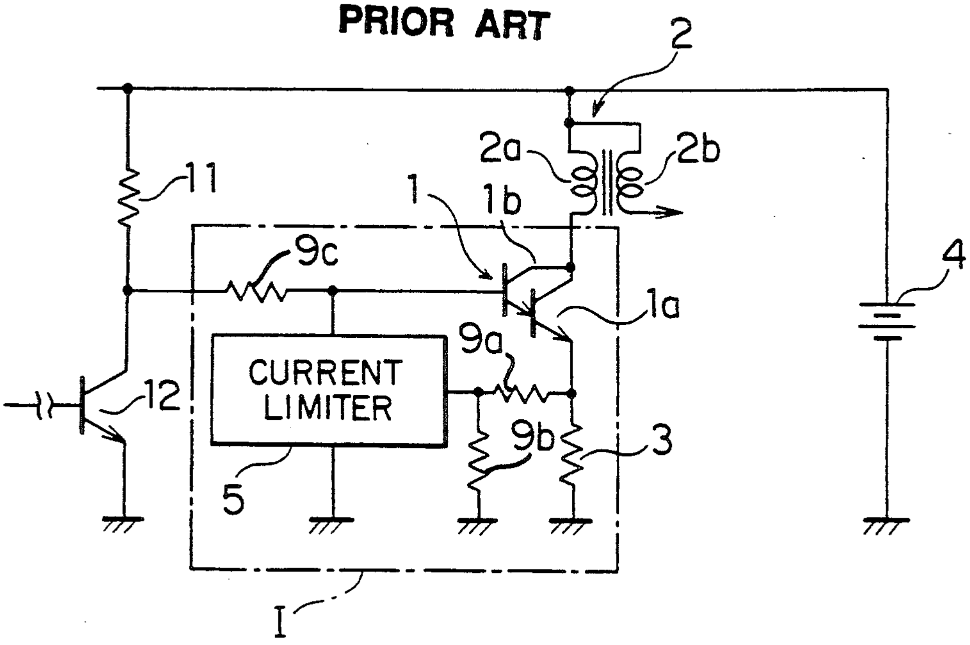
FIG. 6 PRIOR ART
FIG. 6 is a circuit diagram of a known igniter.

In operation, the igniter of this embodiment is connected through the connector 110 to an ignition apparatus for an internal combustion engine (not shown) so that the first connector terminal 110*a* is connected to one end of a primary winding of an unillustrated ignition coil (corresponding to the primary winding 2*a* of the ignition coil 2 of FIG. 6) which has the other end connected to an unillustrated power supply (corresponding to the power supply 4 of FIG. 6), the second connector terminal 110*b* is connected to ground and the third connector terminal 110*c* is connected to an unillustrated signal generator which generates an ignition signal in synchronism with the rotation of the engine at prescribed crank positions. In this state, the transistor circuit 101 is turned on and off by an ignition signal which is supplied thereto from the signal generator through the third connector terminal 110*c*. When the power transistor circuit 101 is turned on, a current flows from the unillustrated power supply into the power transistor circuit 101 via the primary winding of the unillustrated ignition coil, the first connector terminal 110*a* and the lead wire 101*a*, and thence to ground via the lead wire 101*b*, the fourth connector terminal 110*d*, the wire resistor 103 and the second connector terminal 110*b*. At this time, there develops a voltage across the resistor 103 which is fed through the conductive wire 109*a* to the current limiter 105 in the form of the IC chip which controls, based on the detected voltage, the current supplied through the third connector terminal 110*c* and the lead wire 101*c* to the base of the power transistor circuit 101. As a result, the primary current flowing through the power transistor circuit 101 and hence the primary winding of the ignition coil is limited at a proper level.

Figure 7:
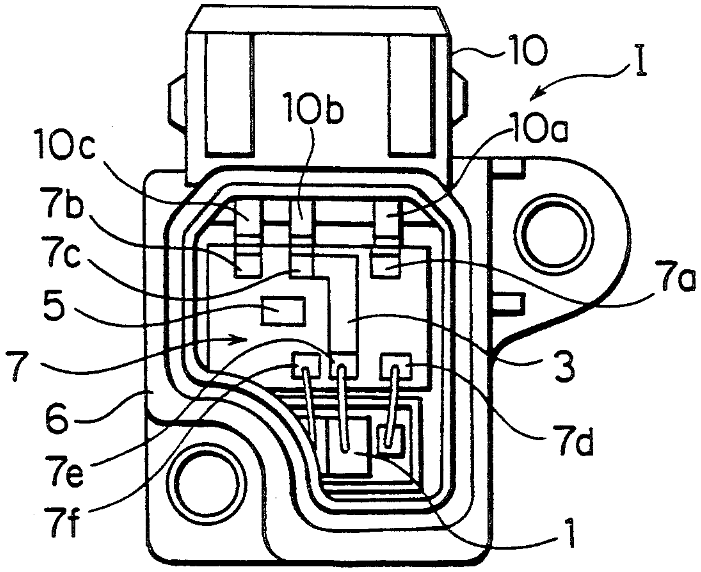
FIG. 7 PRIOR ART
FIG. 7 is a partially cut-away plan view of the known igniter of FIG. 6.

In this embodiment, the current limiter 105 is not integrally formed into an HIC board which is difficult to handle, but instead it is separately formed as a single IC chip which is easy to handle, and simply mounted on the second connector terminal 110*b* without using any elastomeric adhesive as required in the case of the HIC board 7 of the known igniter of FIG. 7. Accordingly, there is no need of a drying process as required in the known igniter for drying the elastomeric adhesive through which the HIC board 7 is secured to the casing 6. Thus, the assembly is greatly simplified and faciliated without requiring excessive care in handling the IC chip and the entire assembling process can be automated easily.

Figure 3:
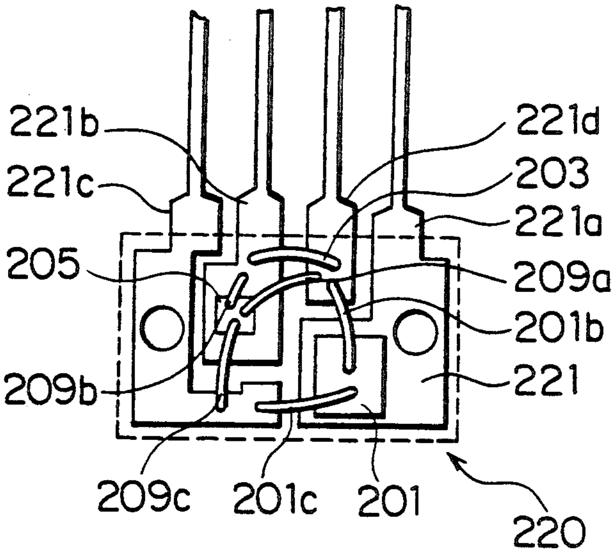
FIG. 3 is a plan view showing the details of an IC package in accordance with the invention.
Figure 4:
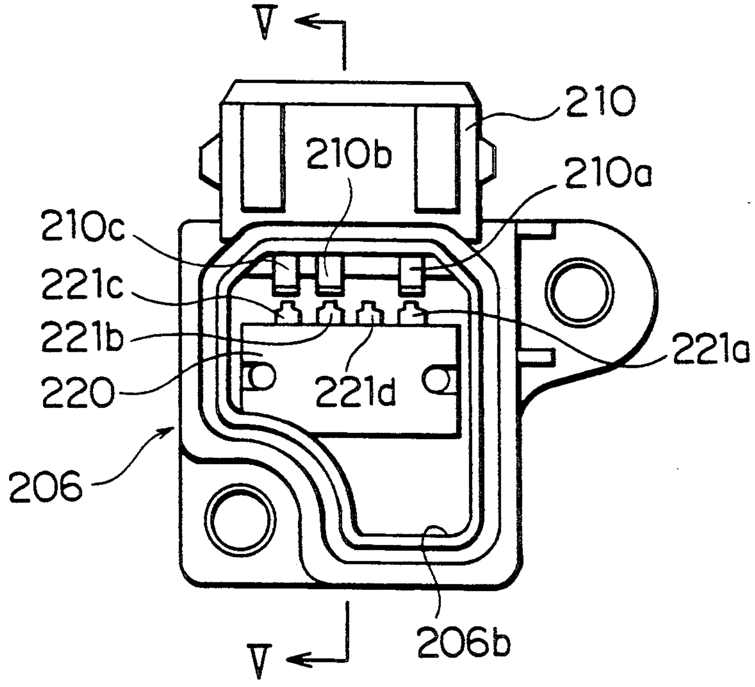
FIG. 4 is a view similar to FIG. 1, but showing another embodiment of the invention employing the IC package of FIG. 3.
Figure 5:
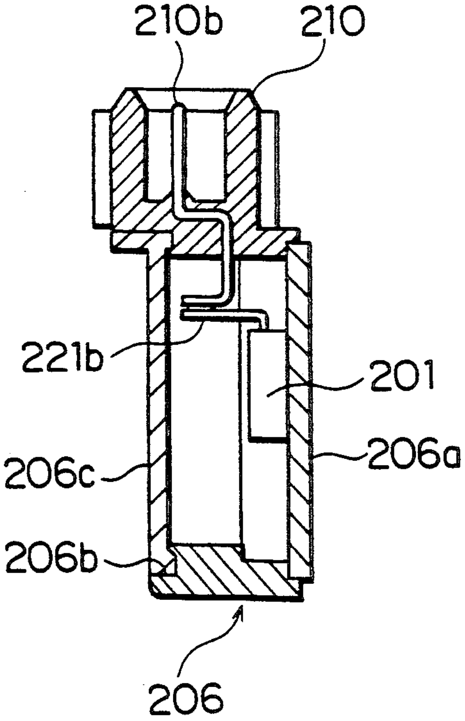
FIG. 5 is a cross section taken along line V—V of FIG. 4.

FIGS. 3 through 5 show another embodiment of the invention. In this embodiment, as shown in FIG. 3, a power transistor circuit 201 (corresponding to the circuit 1 of FIG. 6), a current limiter 206 in the form of an IC chip (corresponding to the current limiter 5 of FIG. 6), a current detecting resistor 203 in the form of a conductive wire (corresponding to the resistor 3 of FIG. 6), and other conductive wires 209*a*–209*c* and lead wires 201*b*, 201*c* are all incorporated in a single resin package 220 including a lead frame 221 having a plurality (four in the illustrated example) of terminal leads 221*a*–221*d* which are separated from each other. Specifically, the IC package 220 is formed as follows. First, the power transistor circuit 201 and the current limiter 205 are mounted on a first and a second terminal lead 221*a*, 221*b*, respectively. The power transistor circuit 201 has a collector directly connected to the first terminal lead 221*a*, an emitter connected through a lead wire 201*b* to the fourth terminal lead 221*d*, and a base connected through a lead wire 201*c* to the third terminal lead 221*c*. The current limiter 205 in the form of an IC chip is connected through a conductive wire 209*a* of aluminum to a junction of the fourth terminal lead 221*d* at which the current detecting resistor 203 and the lead wire 201*b* are connected to each other. The current limiter 205 is also connected through a conductive wire 209*b* of aluminum to the second terminal lead 221*b*, and through a conductive wire 209*c* of aluminum to the third terminal lead 221*c*. Thereafter, the power transistor circuit 201 and the current limiter 205, being mounted on and connected to the lead frame 221 with support members 222 in this manner, are solidly sealed or molded with a resin by a transfer molding technique to provide the IC package 220. After molding, the package 220 is cut off from its support members with those portions of the terminal leads 221*a*–221*d* which project from the resin molding being bent perpendicularly. Subsequently, the IC package 220 thus formed is inserted from an opening 206*b* into and received in place in a flat and generally box-shaped casing 206 having an integral connector 210, and it is fixedly attached to a heat dissipating bottom plate 206*a* of the casing 206 with the bent portions of the terminal leads 221*a*–221*d* being disposed upright. In this case, no elastomeric adhesive is employed as in the known igniter of FIG. 7, which requires drying or heating for an extended period of time until solidified. Then, the uprightly extending bent portions of the terminal leads 221*a*, 221*b* and 221*c* are electrically connected as by soldering to the inner ends of corresponding connector terminals 210*a*, 210*b* and 210*c* which are embedded in the body of the connector 210. Finally, a cover 206*c* is fitted to close the opening 206*b* in the casing 206. In this manner, the igniter of this embodiment is produced.

Thus, in this embodiment, using the lead frame 221, which is much easier to handle and much cheaper than an HIC board as in the known igniter of FIG. 7, the productivity and the manufacturing cost can be substantially reduced. In addition, the transistor circuit 201 and the current limiter 205 mounted on the lead frame 221 are resin molded into the integral package 220 which is compact in size, very convenient to handle and which can be easily mounted on the casing 206 in a reliable manner as compared with the HIC board 7 of the known igniter which is fragile and difficult to handle and can be easily damaged. This results in reduction in the overall size and improvements in reliability and productivity. Moreover, there is no need to provide a protective coating such as 111 of the previous embodiment of FIGS. 1 and 2 for the power transistor circuit 201 and the current limiter 205.

Although in the above embodiments, conductive wires of aluminum are employed, they may be replaced by any other appropriate conductors such as metal foil or the like.

What is claimed is:

1. An igniter for an internal combustion engine comprising:

- a power transistor circuit for turning on and off the current supply to a primary winding of an ignition coil;
- a current detector for detecting a current supplied to the ignition coil primary winding;
- a current limiter for controlling the current supplied to the ignition coil primary winding based on the current detected by said current detector;
- said current detector comprising a conductor separately formed from said current limiter and connected between ground and a junction between said power transistor circuit and said current limiter;
- a casing in which said power transistor circuit, said current detector and said current limiter are housed; and
- a connector integrally formed with said casing and having first, second and third connector terminals which extend at their one end into said casing;
- said power transistor circuit being fixedly mounted on said casing and having a first lead connected to the first connector terminal, a second lead connected to one end of said current detector which is connected at the other end thereof to the second connector terminal, and a third lead connected to the third connector terminal;

said current limiter comprising an IC chip mounted on the second connector terminal and having three leads which are respectively connected to the second connector terminal, the third connector terminal and a junction between said current detector and the first lead of said power transistor circuit.

2. An igniter according to claim 1, wherein said current detector comprises a conductive wire having a predetermined electrical resistance sufficient to develop a measurable voltage thereacross when said power transistor circuit is turned on.

3. An igniter according to claim 1, further comprising a protective coating formed in said casing for covering and protecting said power circuit, said current detector and said current limiter.

4. An igniter for an internal combustion engine comprising:

a power transistor circuit for turning on and off the current supply to a primary winding of an ignition coil;

a current detector for detecting a current supplied to the ignition coil primary winding; and a current limiter for controlling the current supplied to the ignition coil primary winding based on the current detected by said current detector;

said current detector comprising a conductor separately formed from said current limiter and connected between ground and a junction between said power transistor circuit and said current limiter;

wherein said power transistor circuit, said current detector and said current limiter are mounted on a lead frame and resin molded into an integral package having a plurality of terminal leads.

5. An igniter according to claim 4, further comprising a casing having a connector integrally formed therewith, said connector having a plurality of connector terminals which extend at their one end into said casing, wherein said integral package is fixedly mounted on said casing with their terminal leads respectively connected to the connector terminals of said connector.

* * * * *